| United States Patent [19] | [11] | 4,269,636 |
|---|---|---|
| Rivoli et al. | [45] | May 26, 1981 |

[54] METHOD OF FABRICATING SELF-ALIGNED BIPOLAR TRANSISTOR PROCESS AND DEVICE UTILIZING ETCHING AND SELF-ALIGNED MASKING

[75] Inventors: Anthony L. Rivoli, Palm Bay; William R. Morcom, Melbourne Beach; Hugh C. Nicolay, Melbourne Village; Eugene R. Cox, Palm Bay, all of Fla.

[73] Assignee: Harris Corporation, Melbourne, Fla.

[21] Appl. No.: 974,478

[22] Filed: Dec. 29, 1978

[51] Int. Cl.³ .................... H01L 21/20; H01L 21/306
[52] U.S. Cl. .................... 148/175; 29/576 W; 29/578; 29/580; 148/1.5; 148/187; 156/647; 156/648; 156/649; 156/657; 357/49; 357/50; 357/55; 357/91
[58] Field of Search .................... 148/1.5, 175, 187; 29/576 W, 578, 580; 156/647, 648, 649, 657; 357/49, 50, 91, 55

[56] References Cited

U.S. PATENT DOCUMENTS

| 3,492,174 | 1/1970 | Nakamura et al. ................... 148/175 |
| 3,534,234 | 10/1970 | Clevenger .......................... 357/50 X |
| 3,579,058 | 5/1971 | Armgarth .......................... 357/50 X |
| 3,648,125 | 3/1972 | Peltzer ............................. 148/175 X |
| 3,775,192 | 11/1973 | Beale .................................... 148/1.5 |
| 3,840,409 | 10/1974 | Ashar .................................... 148/1.5 |
| 3,858,237 | 12/1974 | Sawazaki et al. ...................... 357/49 |
| 3,878,552 | 4/1975 | Rodgers ............................. 357/50 X |
| 3,900,350 | 8/1975 | Appels et al. ........................ 148/175 |
| 3,919,005 | 11/1975 | Schinella et al. ..................... 148/175 |
| 3,956,033 | 5/1976 | Roberson ............................. 148/175 |
| 3,979,237 | 9/1976 | Morcom et al. .................. 148/187 X |
| 3,992,232 | 11/1976 | Kaji et al. ............................ 148/175 |
| 3,993,513 | 11/1976 | O'Brien ................................ 148/175 |
| 4,048,649 | 9/1977 | Bohn .................................... 357/50 X |
| 4,160,991 | 7/1979 | Anantha et al. ....................... 357/49 |
| 4,175,983 | 11/1979 | Schwabe .......................... 148/187 X |
| 4,191,595 | 3/1980 | Aomura et al. ....................... 148/1.5 |
| 4,199,378 | 4/1980 | Gils .................................. 148/187 X |
| 4,219,835 | 8/1980 | Van Loon et al. ..................... 357/55 |

FOREIGN PATENT DOCUMENTS 52-35987 3/1977 Japan ......................................... 357/55

Primary Examiner—L. Dewayne Rutledge
Assistant Examiner—W. G. Saba
Attorney, Agent, or Firm—Leitner, Palan, Martin & Bernstein

[57] ABSTRACT

A bipolar transistor process and device wherein the transistor is fabricated within a laterally isolated device region, into which is formed a lateral intradevice isolation groove prior to formation of device/active and contact regions. The lateral intradevice isolation groove with the lateral device isolation assists in self-alignment of device regions. The lateral intradevice isolation permits the simultaneous formation through a single mask of an active region and a contact region for a different active region both on the same planar surface of a semiconductor substrate and facilitates extremely close spacing of active regions at the planar surface.

10 Claims, 10 Drawing Figures

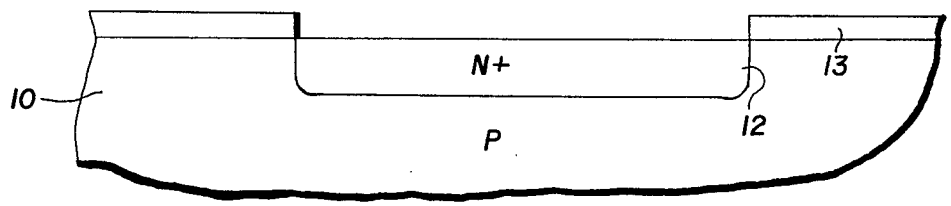
FIG.1
FIG.2
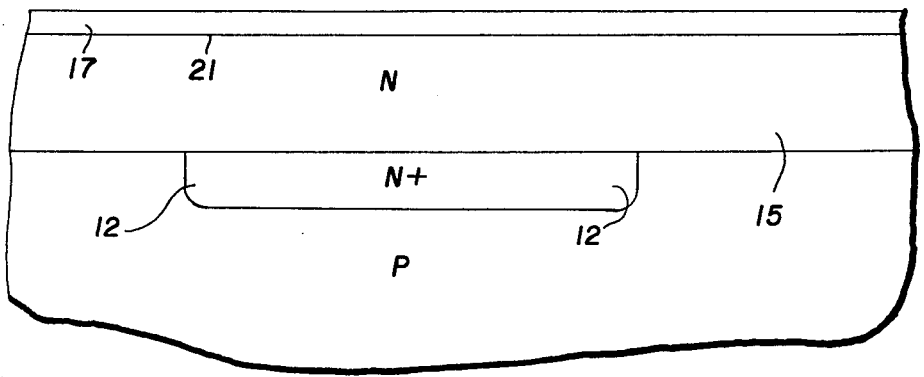
FIG.3
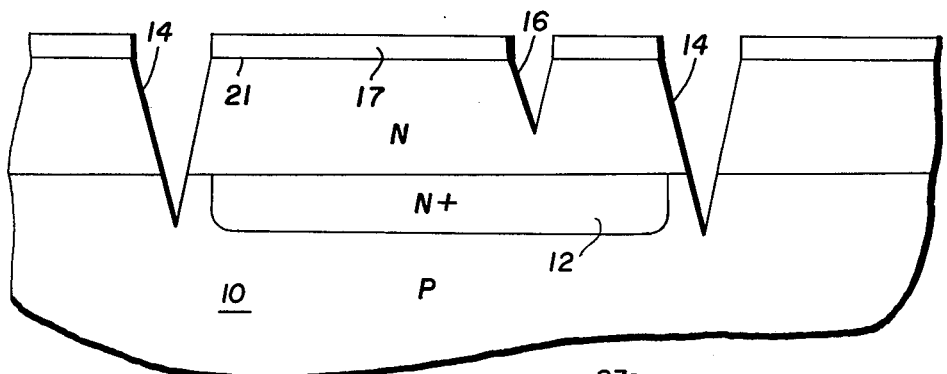
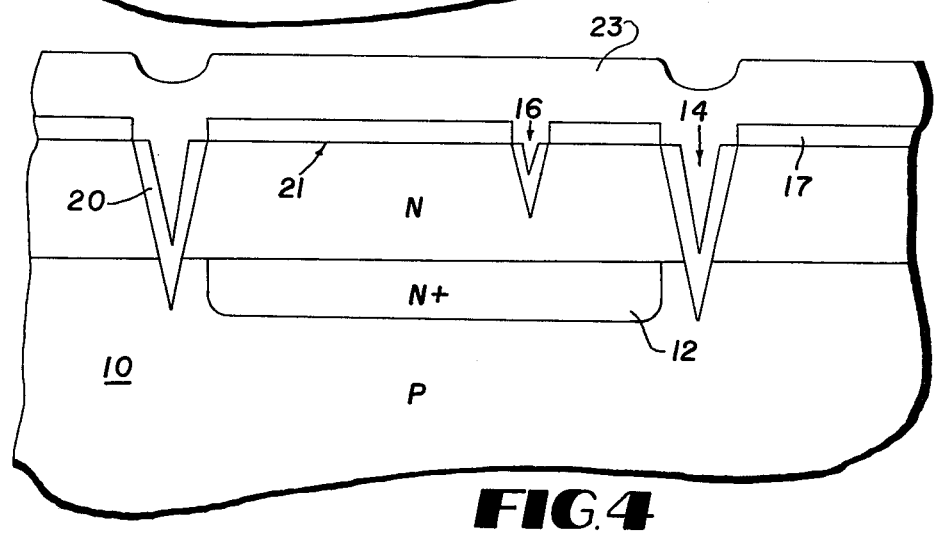
FIG.4

FIG.8
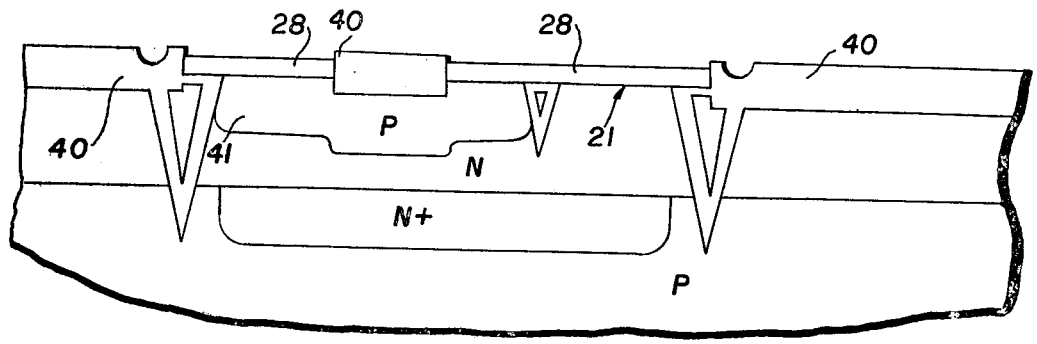
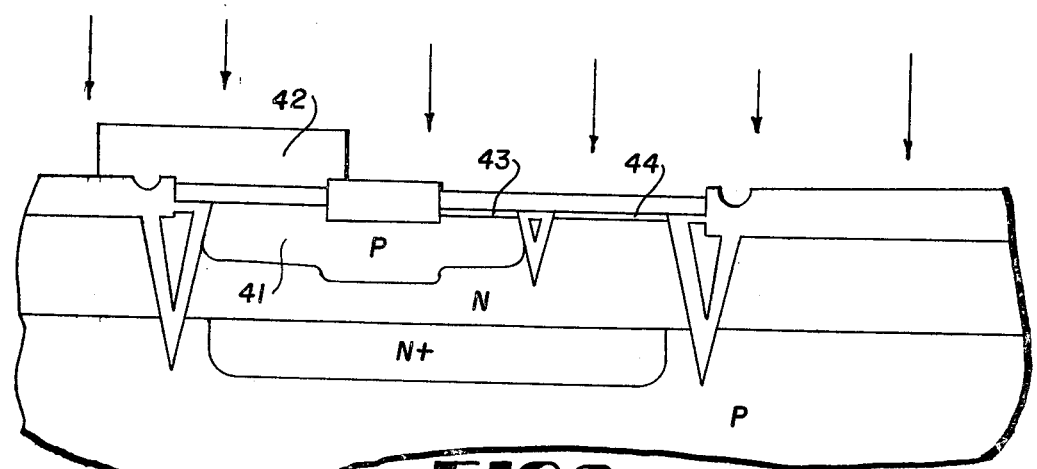
FIG.9
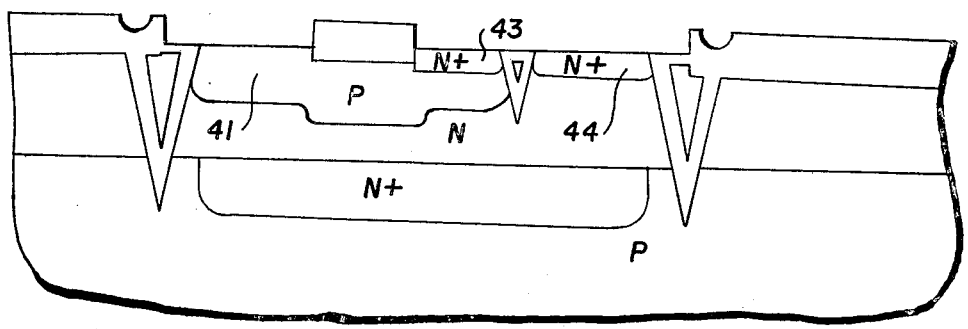
FIG.10

METHOD OF FABRICATING SELF-ALIGNED BIPOLAR TRANSISTOR PROCESS AND DEVICE UTILIZING ETCHING AND SELF-ALIGNED MASKING

BACKGROUND OF THE INVENTION

The present invention involves the field of semiconductor devices and a process of their production. In particular, the invention is directed towards the construction of self-aligned electrically isolated bipolar devices in a semiconductor substrate.

Integrated circuits are generally fabricated as a multiplicity of interconnected devices such as diodes and transistors within a monolithic body of semiconductor material often called a semiconductor wafer. The devices are fabricated side by side within the substrate and must be electrically isolated to prevent the occurrence of any undesired interaction between them. To prevent unwanted interaction, it is common practice to provide some form of electrical isolation barrier between the devices. For example, isolation may be achieved by providing PN junctions between the devices which are readily reverse-biased to preclude current flow across the junction.

While known PN junction isolation techniques have proven successful, they suffer certain disadvantages in that they severely limit the surface area of the semiconductor body available for device fabrication. The reason for this limitation involves the fact that as the lateral isolation region diffuses into the semiconductor body in a direction perpendicular to the generally planar surface of the semiconductor wafer, it also spreads laterally in a direction parallel to the surface. Thus, the PN junction spreads towards the devices which are to be isolated. It is essential that the isolation junction not come in contact with the device to be isolated. Therefore, sufficient space must be provided between devices to account for this lateral spreading.

Another known technique for device isolation, termed the isoplanar technique involves the deposition of a silicon nitride film on the semiconductor surface, the etching of grooves through the film and into the semiconductor body, followed by thermal growth of silicon dioxide to fill the grooves. The silicon nitride film retards the growth of the oxide other than in the grooves. After the grooves are filled, the silicon nitride film is etched away to leave oxide isolated semiconductor islands with a planar surface.

A more desirable isolation technique which can be termed polyplanar is described in U.S. Pat. No. 3,979,237 issued Sept. 7, 1976, to Morcom et al. This technique which may combine the PN junction and isoplanar techniques uses dielectric isolation laterally and PN junction isolation on the bottom. According to the polyplanar isolation technique a thin film of protective material is deposited on the planar surface of a semiconductor wafer in which integrated circuits are to be fabricated. A mask conforming to the desired isolation pattern is provided over the exposed surface of the protective thin film and isolation grooves are etched through the film and into the semiconductor material. The grooves are of a sufficient depth to define the regions within which devices are to be fabricated. An insulator layer such as a film of silicon dioxide is then formed over the surfaces of the grooves. The remaining portions of the grooves are then filled with pyrolytically deposited dielectric material or other fill material capable of withstanding subsequent high temperature processing to the level of the original planar surface of the semiconductor body. Due to limitations in the manufacturing process, the film material will overfill the grooves and will coat surfaces other than the grooves themselves. The protective thin film functions to allow the excess film material to be removed from the surface of the semiconductor wafer without damaging the underlying planar surface of the semiconductor material. After removal of the excess film material, the thin film is removed by etching to expose a planar surface of isolated semiconductor islands. Conventional integrated circuit processing continues from this point. A full and complete description of this polyplanar isolation process is given in the aforementioned patent to Morcom et al and the reader is directed to that patent for a full understanding of this isolation process.

SUMMARY OF THE INVENTION

It is a principal object of the present invention to utilize the polyplanar isolation technique to effect not only device isolation but also to control active region location within a device.

Another object is to use interior lateral isolation as an alignment reference in device fabrication.

It is a further object of the present invention to provide a fabrication technique and device construction which produces an electrically isolated self-aligned bipolar device.

A semiconductor wafer is processed to provide device isolation grooves defining semiconductor islands into which are fabricated circuit devices. Preferably, these isolation grooves are fabricated in accordance with the polyplanar technique described in the aforementioned Morcom et al patent. An additional isolation groove is fabricated into the isolated semiconductor island. The additional isolation groove functions to provide active region and contact isolation as well as alignment within a semiconductor device. The active region-contact isolation is formed in the device region before device fabrication, thereby facilitating self-alignment of active regions and contacts.

An oxidation inhibiting mask is formed over the device region and extends over the device isolation grooves. Portions of the oxidation inhibiting mask are selectively removed to expose all regions of the device area except for active device regions where contact is to be made to the substrate material by a subsequent interconnect metalization system. Device fabrication is then continued by diffusing selected dopant under the control of suitable masks. The oxidation inhibiting layer on the planar surface of the semiconductor wafer, while not preventing diffusion of the dopant does inhibit or limit the quantity of dopant below its surface relative to the quantity received in exposed area of the planar surface.

The device and active region contact isolation grooves, with the oxidation inhibiting mask allow the contacts to self-align to the isolation, permit the base to self-align to the isolation while functioning to cause the emitter to self-align to the contact regions and the isolation. By reason of the oxidation inhibiting layer, base doping may be made lighter under the emitter than it is between the emitter and base contact. The above is achieved with a minimum amount of oxide etching.

The contact areas are all located on the same planar surface of the semiconductor substrate. By providing the intradevice active region contact isolation groove prior to active region formation, the emitter region and collector contact region can be simultaneously formed through a common opening of single mask. The intradevice groove permits close spacing of the emitter and collector contact at the planar surface in the completed device.

BRIEF DESCRIPTION OF THE DRAWINGS

FIGS. 1-10 are cross-sectional views of a semiconductor body of a process incorporating the principles of the present invention at various stages of fabrication.

DESCRIPTION OF THE PREFERRED EMBODIMENTS

Figure 5:
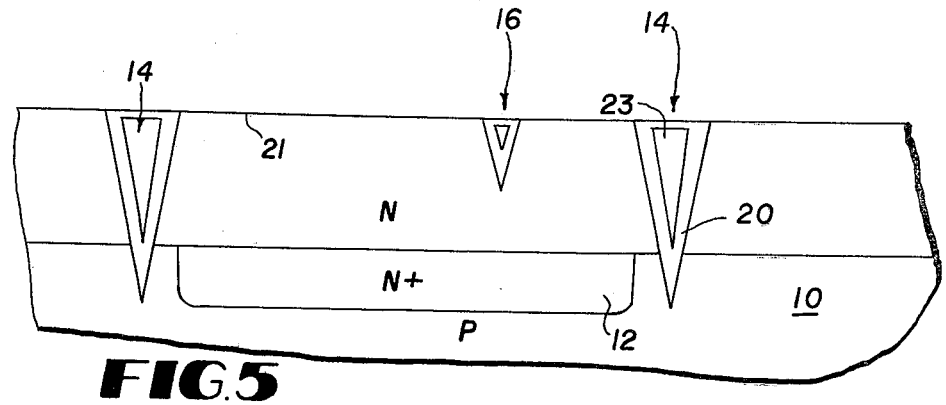
Figure 6:
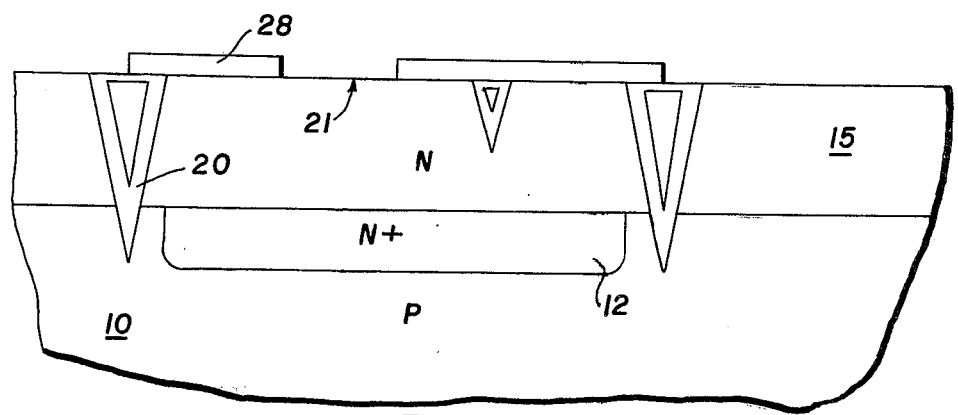
Figure 7:
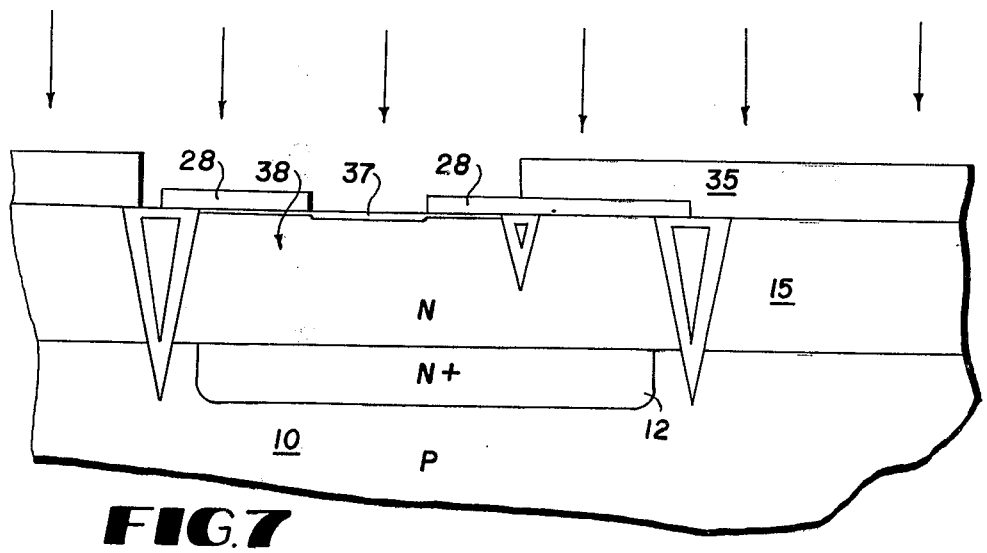

It is desired to fabricate a self-aligned electrically isolated semiconductor device within a semiconductor body or wafer as it is often termed. The body is comprised of a substrate 10 formed from a first conductivity type semiconductor material such as P type silicon. N type silicon may also be used to establish the semiconductor substrate, with the conductivity of the semiconductor substrate being immaterial to the teachings of the present invention. For purpose of explanation, the substrate will be assumed to be of P type silicon. If desired, a buried layer 12 of N type semiconductor material can be formed in the P type semiconductor substrate 10. Various known techniques can be used to produce the buried layer 12. For example, the buried layer may be fabricated using a standard photo masking step along with diffusion of an implanted or a deposited dopant. Photo masking refers to the conventional process of applying a layer of a photoresist polymer 13 to the surface of the semiconductor substrate 10, selectively exposing the photoresist by radiation of an appropriate wave length and developing the photoresist to leave a desired pattern. This procedure is followed by an active step such as diffusion as illustrated in FIG. 1. Next a layer 15 such as an epitaxial layer of N type silicon is formed over the substrate and the buried layer to produce the semiconductor body. The process of forming the buried layer is well known and, therefore, is neither illustrated or described in great detail herein. The invention to be described in detail is not constrained to a semiconductor substrate with a buried layer and if desired, a semiconductor substrate without a buried layer may be utilized.

In accordance with the teachings of this invention, device isolation grooves 14 and active region-contact isolation grooves 16 are formed at selected locations in the semiconductor body to provide device isolation and active region contact isolation within a device. Preferably, the isolation grooves are fabricated in accordance with the teachings of the aforementioned Morcom et al patent. In accordance with one technique of the Morcom patent, a thin film of material 17 capable of withstanding polishing is deposited or otherwise formed on the exposed surface 21 of the epitaxial layer 15 as illustrated in FIG. 2. The thin hard film may be composed of silicon nitride, silicon carbide or aluminum oxide deposited to a thickness of 1000 to 2000 angstroms (A). An isolation pattern (not shown) is then defined in the thin layer by a conventional photo masking operation. Isolation grooves 14 and 16 are then etched into the semiconductor body. The substrate 10 and consequently the epitaxial layer 15 is selected to provide planar surface 21 having a [100] plane crystal orientation. The depth of the etched groove is a function of the mask aperature. This allows simultaneous etching of the device isolation grooves 14 whose depth must extend through the epitaxial layer 15, exceeding the depth of the device regions, into the semiconductor substrate 10, and the active region-contact isolation groove 16, whose depth should be sufficiently deep to define active regions of the device, by using different size mask apparatus. If desired, the groove 14 and 16 may be formed separately. The resulting structure is illustrated in FIG. 3.

Thereafter a thin insulator layer 20 is formed on the surface of each of the grooves 14 and 16. The insulator layer 20 may be silicon dioxide thermally grown to a thickness of about 6000 angstroms. The remainder of each groove may be filled with any suitable material 23 such as polycrystalline silicon or pyrolytically deposited silicon dioxide as illustrated in FIG. 4. Any excess fill material and any silicon dioxide from layer 20 over the surface 21 of the semiconductor body is polished away by conventional machine polishing of the wafer. The top of the grooves are removed to be recessed from surface 21. The previously deposited thin film 17 on the surface assures that the polished surface conforms to the planar surface of the film. The film also protects the underlying planar surface of the semiconductor from any damage during the polishing process. The recessed groove is filled by selective thermal oxidation to form a surface layer of silicon dioxide. The film is then etched away to expose the planar surface of the device islands, each island being defined by device isolation groove 14. Within each device island is at least one active region-contact isolation groove 16. The wafer at this stage is illustrated in FIG. 5. It will be understood that the layer and film dimensions shown in the drawing are for the sake of clarity only and are not intended to designate relative or actual thicknesses of the layers and films.

An oxidation inhibiting mask 28 is now formed over portions of the planar surface 21 of the semiconductor wafer where devices are to be formed. This oxidation inhibiting layer may be formed in the following manner. An insulating layer of silicon nitride of approximately 1000 to 2000 angstroms in thickness is formed on the surface 21 by a conventional deposition process. After the silicon nitride layer is formed, a photo masking scheme is used to remove the masking layer 28 from all areas except where the contact regions of the device will be formed. Preferably, the oxidation inhibiting layer 28 extends beyond the device region and overlaps the device isolation grooves 14 to make the contact and active regions self-aligned to the device isolation. Of course, other oxidation inhibiting layers may be used to fabricate the mask of 28. This oxidation inhibiting mask 28 will remain on the wafer over the device areas during subsequent fabrication steps to form a bipolar transistor within the device area, which transistor has all of its contact areas on the planar surface 21.

Fabrication of the bipolar device in accordance with the teachings of this invention will now be described. The base region dopant can be provided using ion implantation techniques. The base region may be defined using conventional photo masking techniques. An ion implantation mask 35 is deposited over the device area to define the base area to be implanted with suitable dopant. The base region is self-aligned in that isolation groove 14 and active contact region isolation groove 16 serve as the edges of the base region. Using an appropriate element, appropriate energy and dose, the base dopant 37 is implanted. For example, boron, the most common acceptor dopant may be used. It should be noted that areas 38 are covered by the oxidation inhibiting mask 28. Therefore, the doping underneath this area mask 28 will be lighter in concentration and shallower in penetration than other implanted areas. The variation in doping is dependent upon implant energy. The ion implantation mask 35 is now removed by conventional techniques.

The next step in the fabrication process involves an oxidation diffusion step to obtain the desired base parameters. For example, the semiconductor wafer is placed in an oxidation atmosphere at 1050° C. to obtain a doping concentration of $5 \times 10^{18}/cm^{+3}$ to a depth of 0.6 microns within the wafer. The oxidation inhibiting mask 28 prevents oxidation in the contact regions. The wafer is then removed from the oxidizing atmosphere. As shown in FIG. 8, the wafer now bears an oxide insulation layer 40 over the previously exposed semiconductor planar surface 21 and a diffused base region 41.

A second ion implantation mask, 42 formed using a conventional photo masking scheme is deposited to define the active emitter region 43 and collector contact region 44 using a single opening in the mask. Using an appropriate element, energy and dose the emitter and collector contact region dopant is implanted. The oxide layer 40 on the base 41 provides with active contact region groove 16 a self-alignment for the emitter region 43 and active contact region groove 16 and device isolation groove 14 provide a self-alignment for the collector contact 44. Also the oxide layer 40 on the base 41 and the other device isolation groove 14 provide a self-alignment for the base contact.

Thereafter, all masking material, that is, both the ion implantion mask and the oxidation inhibiting mask are removed. If desired, the oxidation inhibiting mask 28 could have been removed prior to the deposition of the ion implantation mask which defines the emitter and collector contact implant.

A thermal diffusion step now activates the emitter and collector contact implants as shown in FIG. 10. For example, the substrate 10 may be placed in an inert atmosphere at a temperature of 900° C. for 20 minutes to provide an emitter having a concentration of $1 \times 10^{20}/cm^3$ to a depth of 0.3 microns.

Any oxide on the contacts are thereafter removed and the wafer is now ready for appropriate interconnection processing.

The above technique produces bipolar integrated circuit devices in a semiconductor wafer which device has self-aligned contact region to the isolation, has a self-aligned base to the isolation and further has a self-aligned emitter region to the contact regions and the isolation. Base doping is lighter under the emitter than it is between the emitter and base contact. The construction herein described produces the bipolar device with a minimum amount of oxide etching.

What is claimed:

1. A method for forming circuit devices in a semiconductor body having a planar surface, which comprises:
   forming first and second grooves through said planar surface of the semiconductor body to a depth below the region in said semiconductor body wherein a circuit device is to be formed without severing the semiconductor body, the device region being situated between said pair of grooves;
   forming a third groove through said planar surface of the semiconductor body within the device region to a depth such that the bottom of said second grooves remain within said device region;
   filling said grooves with dielectric material to form lateral dielectric isolation regions;
   forming an oxidation inhibiting layer on said planar surface over said device region and overlapping at least a portion of each of said first and second grooves;
   removing portions of said oxidation inhibiting layer to expose selected areas of said device region which areas do not include contact regions of active regions of the device being formed;
   selectively providing a first dopant through said oxidation inhibiting layer to form a first active region self-aligned between said first groove and said third groove;
   thermally oxidizing said semiconductor body to diffuse said first dopant into said first active region while forming a thick oxide layer on said planar surface in areas not protected by said oxidation inhibiting layer with openings for contact regions of the device being formed;
   selectively providing a second dopant through said oxidation inhibiting layer to form a first contact region self-aligned between said second groove and said third groove and a second active region between said third groove and a portion of said thick oxide layer over a portion of said first active region;
   diffusing said second dopant to form said first contact region and said second active region self-aligned to said second and third grooves; and
   removing said oxidation inhibiting layer to expose contact areas to said first and second active regions and said first contact region.

2. The method of claim 1 wherein said steps of providing said first and second dopants include ion implanting said dopants through said oxidation inhibiting layer, and said step of oxidizing forms a thick oxide layer sufficiently thick to mask portions of said semiconductor body thereunder from said second dopant.

3. The method of claim 1 wherein said step of providing said first dopant includes forming a first masking layer extending over said second groove and said third groove, the device region between said third groove and said first groove being exposed to receive said first dopant to define said first active region self-aligned between said first groove and said third groove.

4. The method of claim 1 wherein said step of providing said second dopant includes forming a second masking layer extending over said first groove and over the contact area of said first active region, said second masking layer and said thick oxide layer defining a single aperture exposing a portion of the planar surface of said semiconductor substrate through which said second active region and said first contact region of a third active region will be simultaneously formed.

5. A process for fabricating integrated circuit devices comprising:
   forming a first set of grooves in the planar surface of a semiconductor body to define semiconductor islands into which devices may be formed, said first grooves descending to a depth below the region into which devices are formed;
   forming a second set of grooves in said planar surface, the grooves of said second set situated alternately between the grooves of said first set, said grooves of said second set descending to a depth within the device region;

coating the surface of said first and second sets of grooves with a film of dielectric material;

filling the remainder of said groove spaces with high temperature resistant material;

depositing an oxidation inhibiting layer over the planar surface of said semiconductor body;

defining an oxidation inhibiting masking pattern by removing selected portions of said oxidation inhibiting layer over said device regions, maintaining said oxidation inhibiting layer over the junctions between device regions and said first set of grooves and over contact areas of active regions of devices to be formed;

defining a first active region within device regions self-aligned with said first and second set of grooves by forming a first dopant resistant mask over portions of said oxidation inhibiting layer and said device regions;

providing dopant through said mask to form said first active region;

thermally diffusing said dopants;

defining a second active region and a contact region of a third active region within device regions self-aligned with said first and second set of grooves by forming a second dopant resistant mask over portions of said device regions;

providing dopant through said second mask to simultaneously form said second active and said contact region; and removing said oxidation inhibiting layer to expose contact areas to said first and second active regions and said contact region.

6. The process of claim 5 wherein said step of providing dopant to form said active and contact region includes ion implanting dopant into said active and contact regions and said step of thermally diffusing said dopant through said first active region includes heating said semiconductor body in an oxidizing atmosphere.

7. The process of claim 6 wherein said semiconductor body is silicon of a first conductivity type, said dopant diffused to form said first active region produces a region of second conductivity type different from the first conductivity type, and said dopant diffused to form said second active and contact regions provides regions of the first conductivity type but of an impurity concentration different from that of said semiconductor body.

8. The process of claim 5 wherein said dopant resistant mask defining said first active region is defined to expose device areas between a groove of said first set and a groove of said second set and to cover device areas between said groove of said second set and another groove of said first set, said two grooves of the first set defining a semiconductor island.

9. The process of claim 8 wherein said second dopant resistant mask defining said second active region and contact region of a third active region is defined to expose device areas previously protected from dopant exposure on one side of a groove of said second set and a portion of device areas which have already received dopant on the other side of said groove of said second set to simultaneously expose the regions to receive said second active region and said contact region.

10. The process of claim 9 wherein said dopant is provided to said active regions and contact regions of devices by diffusion, said dopant being diffused to a first depth in the device region not covered by said oxidation inhibiting layer and to a second depth less than said first depth in portions of said device region covered by said oxidation inhibiting layer, neither said first or second depth being greater than the depth of said second set of grooves.

* * * * *